US009209288B2

(12) United States Patent
Avci et al.

(10) Patent No.: US 9,209,288 B2
(45) Date of Patent: Dec. 8, 2015

(54) REDUCED SCALE RESONANT TUNNELING FIELD EFFECT TRANSISTOR

(71) Applicant: Intel Corporation, Santa Clara, CA (US)

(72) Inventors: Uygar E. Avci, Portland, OR (US); Dmitri Nikonov, Beaverton, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 125 days.

(21) Appl. No.: 13/723,634

(22) Filed: Dec. 21, 2012

(65) Prior Publication Data
US 2014/0175376 A1 Jun. 26, 2014

(51) Int. Cl.
| H01L 29/772 | (2006.01) |
| H01L 29/267 | (2006.01) |
| H01L 29/739 | (2006.01) |
| H01L 29/165 | (2006.01) |
| H01L 29/205 | (2006.01) |
| B82Y 10/00 | (2011.01) |
| H01L 29/06 | (2006.01) |

(52) U.S. Cl.
CPC ............ H01L 29/772 (2013.01); H01L 29/165 (2013.01); H01L 29/205 (2013.01); H01L 29/267 (2013.01); H01L 29/7391 (2013.01); B82Y 10/00 (2013.01); H01L 29/068 (2013.01); H01L 29/0673 (2013.01)

(58) Field of Classification Search
None
See application file for complete search history.

(56) References Cited

U.S. PATENT DOCUMENTS

| 6,897,098 | B2 | 5/2005 | Hareland |
| 2007/0178650 | A1* | 8/2007 | Chen et al. ................. 438/301 |
| 2008/0050881 | A1 | 2/2008 | Chen et al. |
| 2008/0224224 | A1 | 9/2008 | Vandenderghe et al. |
| 2009/0224228 | A1 | 9/2009 | Razeghi |
| 2012/0106236 | A1* | 5/2012 | Singh et al. ................. 365/154 |
| 2012/0298959 | A1* | 11/2012 | Verhulst et al. ............ 257/27 |
| 2013/0021061 | A1* | 1/2013 | Bjoerk et al. .............. 326/54 |

FOREIGN PATENT DOCUMENTS

KR 10-2008-0053904 A 6/2008

OTHER PUBLICATIONS

Vinay Saripalli, et al. "An Energy-Efficient Heterogeneous CMP Based on Hybrid TFET-CMOS Cores" In: Design Automation Conference (DAC), 2011 48th ACM/EDAC/IEEE. New York: IEEE, 2011, ISBN 978-1-4503-0636-2, pp. 729-734.
International Search Report and Written Opinion for International Application No. PCT/US2013/048236 mailed Jan. 20, 2014.
Van Zeghbroeck, B., "Semiconductor Fundamentals", Principles of Semiconductor Devices, 2011, 5 pages.

* cited by examiner

Primary Examiner — Andres Munoz
(74) Attorney, Agent, or Firm — Trop, Pruner & Hu, P.C.

(57) ABSTRACT

An embodiment includes a heterojunction tunneling field effect transistor including a source, a channel, and a drain; wherein (a) the channel includes a major axis, corresponding to channel length, and a minor axis that corresponds to channel width and is orthogonal to the major axis; (b) the channel length is less than 10 nm long; (c) the source is doped with a first polarity and has a first conduction band; (d) the drain is doped with a second polarity, which is opposite the first polarity, and the drain has a second conduction band with higher energy than the first conduction band. Other embodiments are described herein.

14 Claims, 10 Drawing Sheets

REDUCED SCALE RESONANT TUNNELING FIELD EFFECT TRANSISTOR

BACKGROUND

A Tunnel Field Effect Transistor (TFET) structure is similar to a metal oxide semiconductor field effect transistor (MOSFET) structure and includes a source, a drain, and a channel coupled to a gate. TFETs are available in different forms, such as n type (nTFET) and p type (pTFET) devices. The drain current ($I_d$) increases with increasing gate voltage ($V_g$) for an nTFET and increases with decreasing $V_g$ for a pTFET. The nTFET switches on ("on state") for a gate/source voltage ($V_g$) greater than the threshold voltage, while the pTFET switches on for a $V_g$ less than the threshold voltage. The source in an nTFET is p doped while the drain is n doped and the source in a pTFET is n doped while the drain is p doped. The channel is undoped or less doped, in terms of doping concentration, than the source or drain.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

In the following description, numerous specific details are set forth but embodiments of the invention may be practiced without these specific details. Well known circuits, structures and techniques have not been shown in detail to avoid obscuring an understanding of this description. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

A MOSFET's inverse "subthreshold slope", $dVg/d_{log}(I_d)$ has a theoretical lower limit of 60 mV/decade ("dec") at room temperature. Subthreshold slope concerns the slope of current-voltage characteristics near the device's "off state" (i.e., where $I_d$ is small, also referred to as $I_{off}$ or "off current"), and the device's "on state" (i.e., where there is substantial $I_d$, also referred to as $I_{on}$ or "on current"). For a given off current target (which is determined by a standby power requirement for a device that includes the MOSFET) $I_d$ for a MOSFET can only increase at this maximum rate of 60 mV/dec. This limits the on current and, consequently, circuit performance (e.g., speed of transistor switching). For low active power devices, operation at lower supply voltages is desirable because of the strong dependence of active power on supply voltage (proportional to supply voltage to the power of 2). However, due to the MOSFET's limited subthreshold slope, when a MOSFET is operated at low supply voltages the on current is significantly lower because the MOSFET is operating close to its threshold voltage (which is needed to convert from off state to on state).

Figure 1:
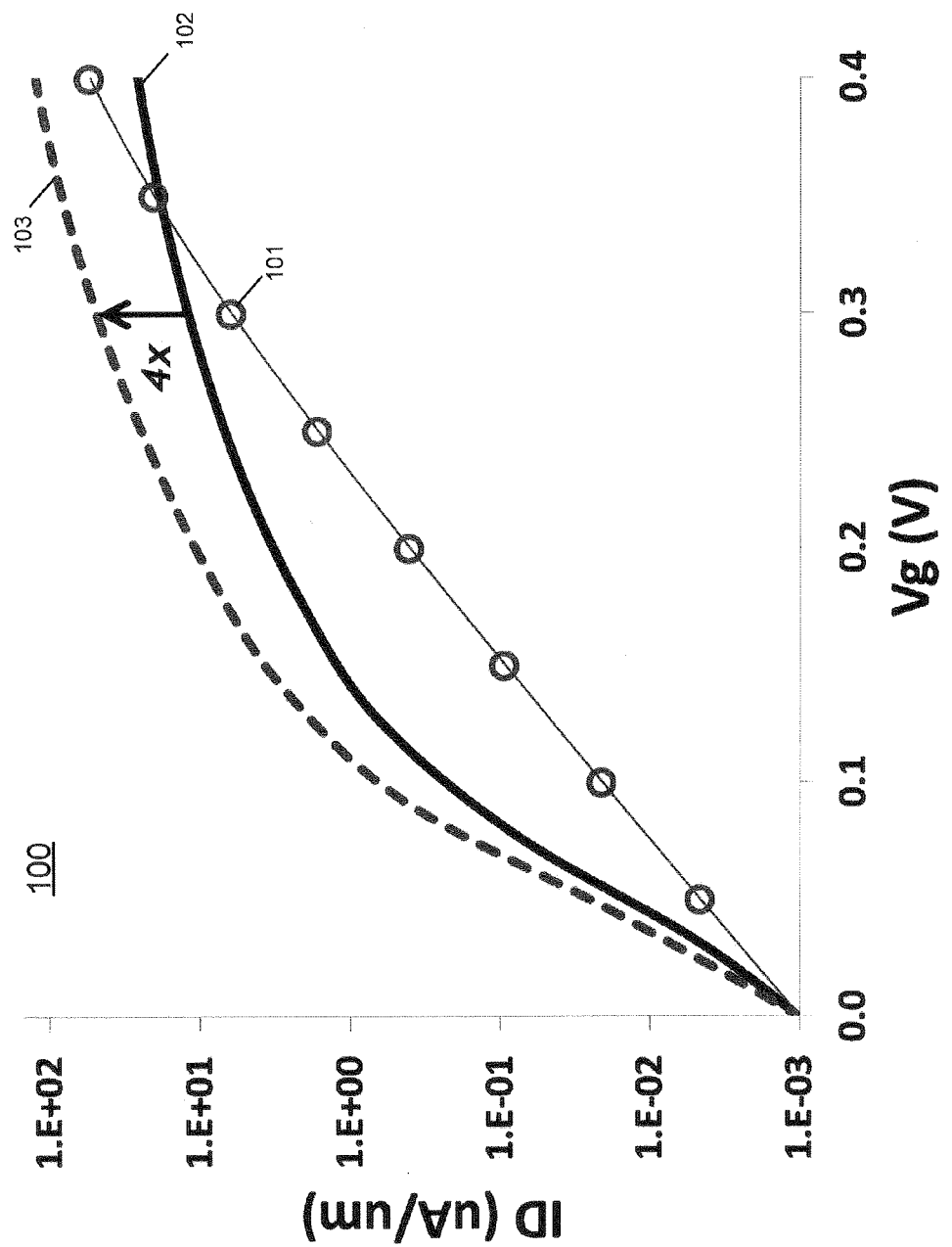
FIGS. 1-2 concern MOSFET, TFET and heterojunction TFET (heTFET) off/on state characteristics.

FIG. 1 depicts various transistor performance characteristics that show, for example, a TFET (trace 102) may have a sharper turn on behavior (i.e., steeper subthreshold slope) than a MOSFET (trace 101). The conditions for FIG. 1 includes an $I_{off}$ of 1 nA/μm, equivalent oxide thickness (EOT) of 0.8 nm, and gate length ($L_g$)=15 nm. This sharpness advantage for the TFET is shown in FIG. 1 from $V_g$ of 0.0 to 0.2 V, where MOSFET 101 has a 74 mV/dec slope and TFET 102 has a 41 mV/dec slope in that same range. In other words, the TFET has a steeper and more desirable subthreshold slope. This enables higher on currents than with the MOSFET when the devices are driven at low supply voltages. An heTFET (trace 103) uses a combination of two semiconductor materials (one for the source and another for the channel and drain; hence the term heterojunction) to enable higher tunneling current and better TFET characteristics. The subthreshold slope for heTFET 103 is about 35 mV/dec, better (steeper) than TFET 102 or MOSFET 101.

Figure 2:
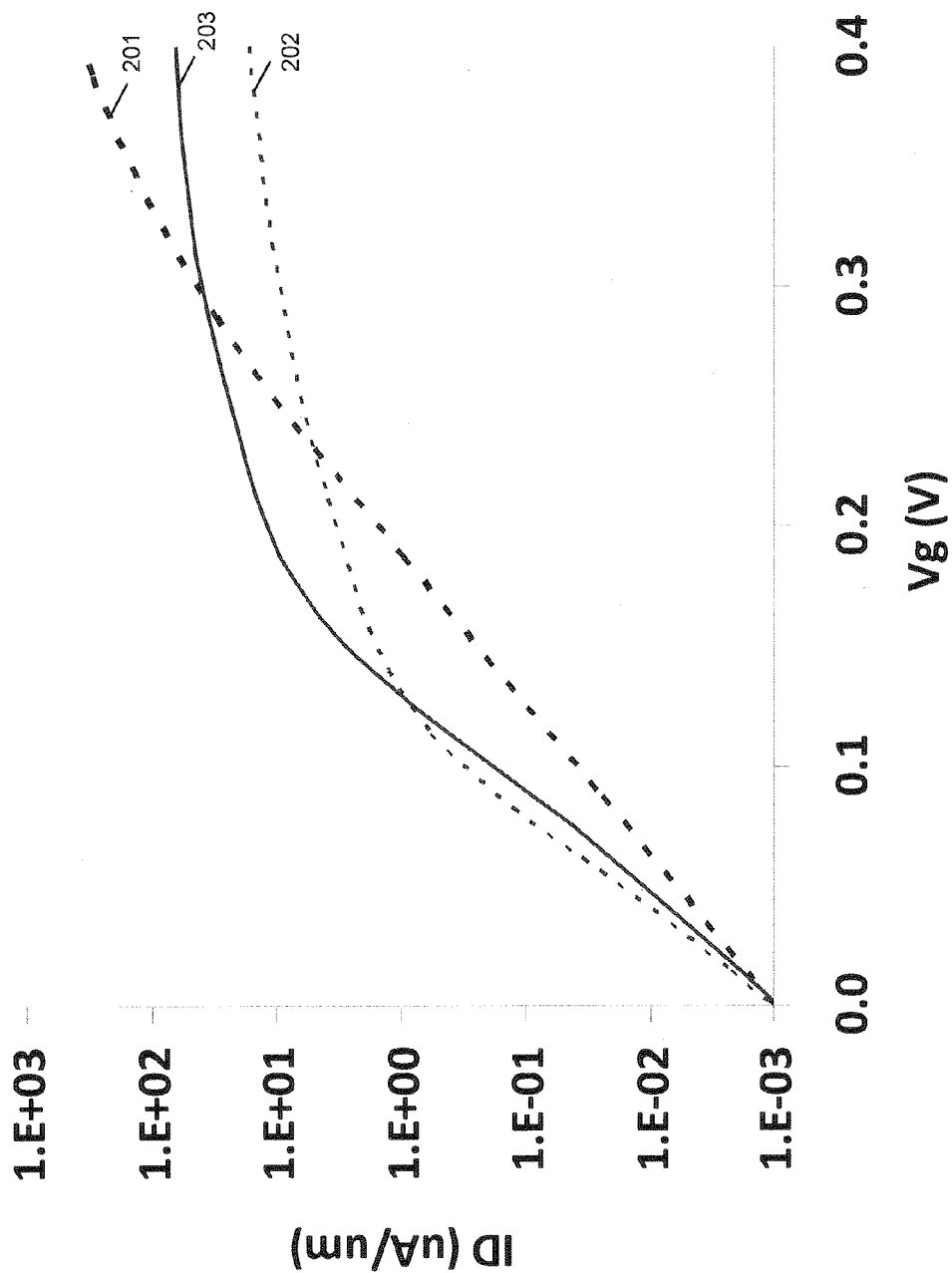

However, this advantage of TFET devices over MOSFETs gets smaller at aggressively scaled (shorter) gate lengths. While FIG. 1 included data for devices with an $L_g$ of 15 nm, FIG. 2 includes data for the same conditions as FIG. 1 but for an $L_g$ of only 9 nm. FIG. 2 illustrates the subthreshold slopes for 201, 202, 203 are similar for $V_g$ of 0.0 to 0.1 V, in contrast to FIG. 1 showing the clear advantage (steeper slopes) in that same range of the TFETs to the MOSFET. The subthreshold slope differential between the three devices decreases as gate length decreases. In other words, traces 202 and 203 (which are both TFETs) have less slope steepness improvement compared to the MOSFET between FIGS. 1 and 2.

Figure 3:
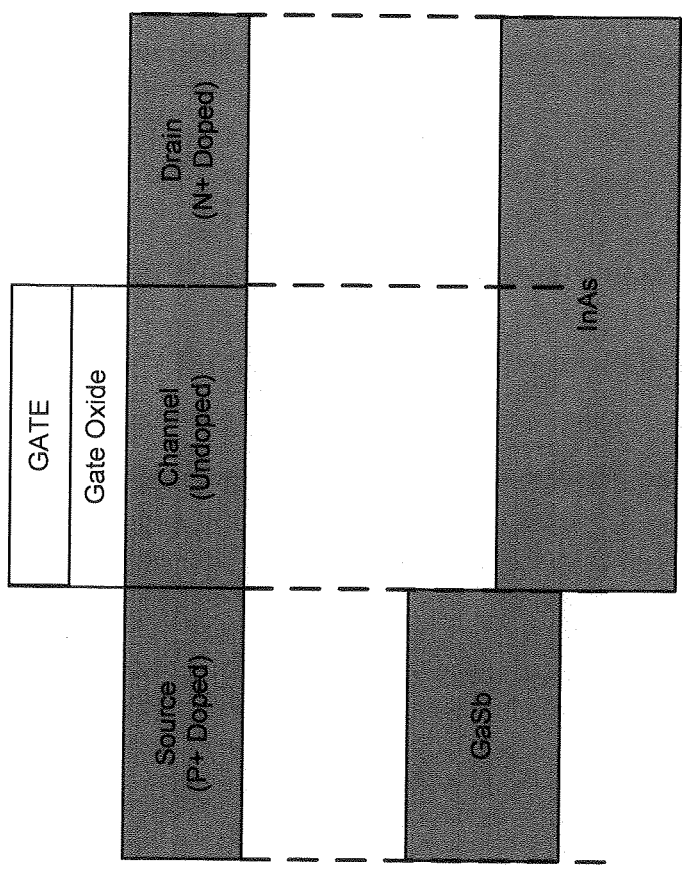
FIG. 3 concerns a conventional heTFET structure.
Figure 4:
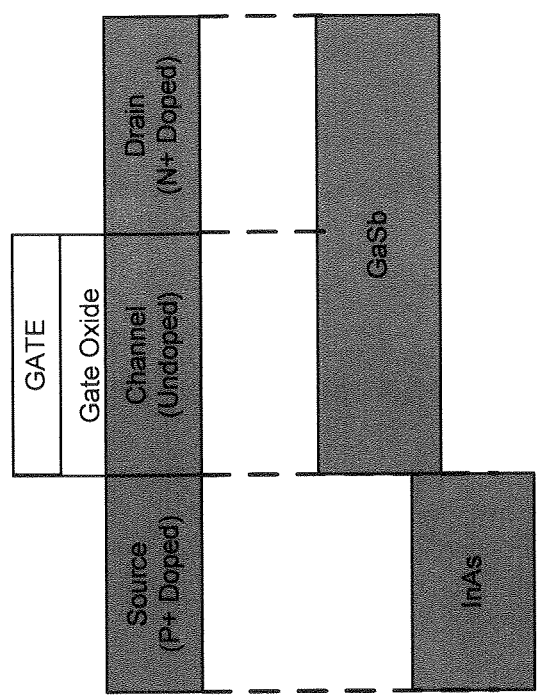
FIG. 4 concerns a reverse heTFET structure in an embodiment.

FIG. 3 depicts a conventional heTFET design combining semiconductor material at the source (e.g., gallium antimonide (GaSb)) with a lower conduction band material at the channel and drain (e.g., indium arsenide (InAs)). In contrast, FIG. 4 depicts an embodiment of the invention that includes a reverse heTFET where the band material order is switched. In other words, reverse heTFET design of FIG. 4 combines semiconductor material at the source (e.g., InAs) with a higher conduction band material at the channel and drain (e.g., GaSb). Still, in FIG. 4 the band discontinuity from the disparate materials works against tunneling current density and makes for a much harder tunneling path.

Embodiments of the invention are not limited to source/drain combinations such as the above described InAs/GaSb material system. Other embodiments include material combinations that create significant band discontinuity. Other examples comprise materials such as silicon (Si), germanium (Ge), phosphorous (P), and include, but are not limited to, source/drain combinations such as: Si/InAs, Si/SiGe, GaAsSb/InAsSb, and InGaAs/InP.

Figure 6:
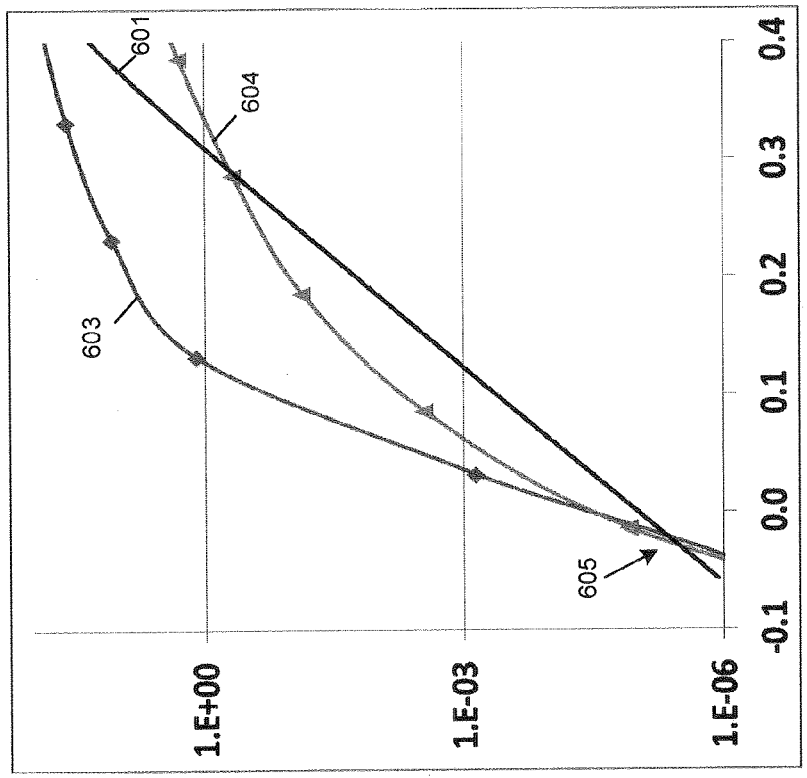
FIGS. 5-6 concern MOSFET, heTFET and reverse heTFET off/on state characteristics in an embodiment.
Figure 5:
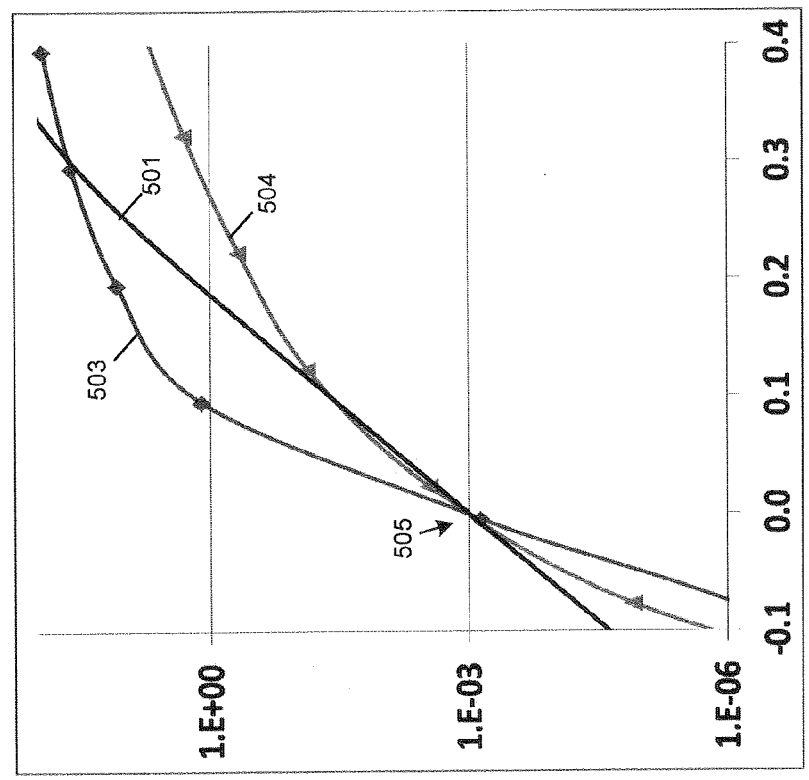

This can be seen from the operation characteristics difference between conventional and reverse heTFET devices each with $L_g$=20 nm, which are illustrated in FIGS. 5 and 6. In FIGS. 5 and 6 MOSFET (traces 501, 601), conventional heTFET (source=GaSb, drain=InAs) (traces 503, 603), and reverse heTFET (source=InAs, drain=GaSb) (traces 504, 604) are plotted for off current targets of 1 nA/μm (FIG. 5, element 505) and 10 pA/μm (FIG. 6, element 605). These figures show conventional heTFETs have higher on-current than reverse heTFETs for various off-current targets and supply voltages when the devices have $L_g$=20 nm.

Figure 7:
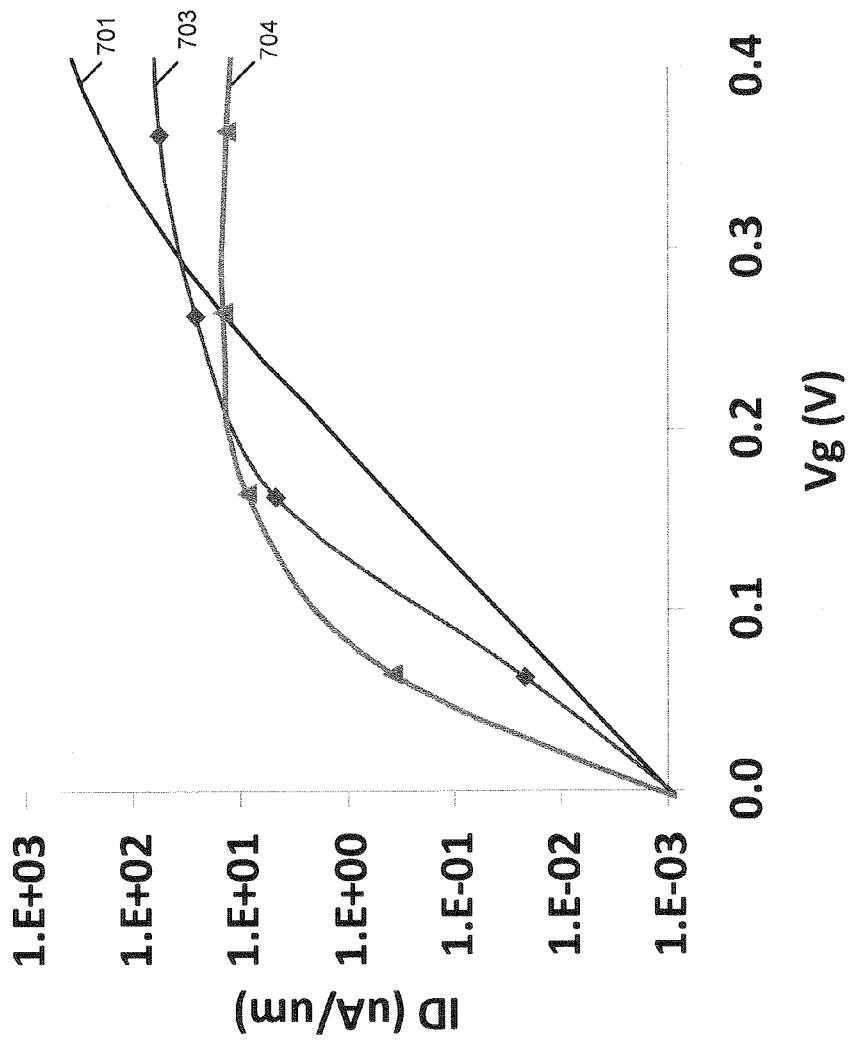
FIGS. 7-8 concern MOSFET, heTFET and reverse heTFET off/on state characteristics in an embodiment.
Figure 8:
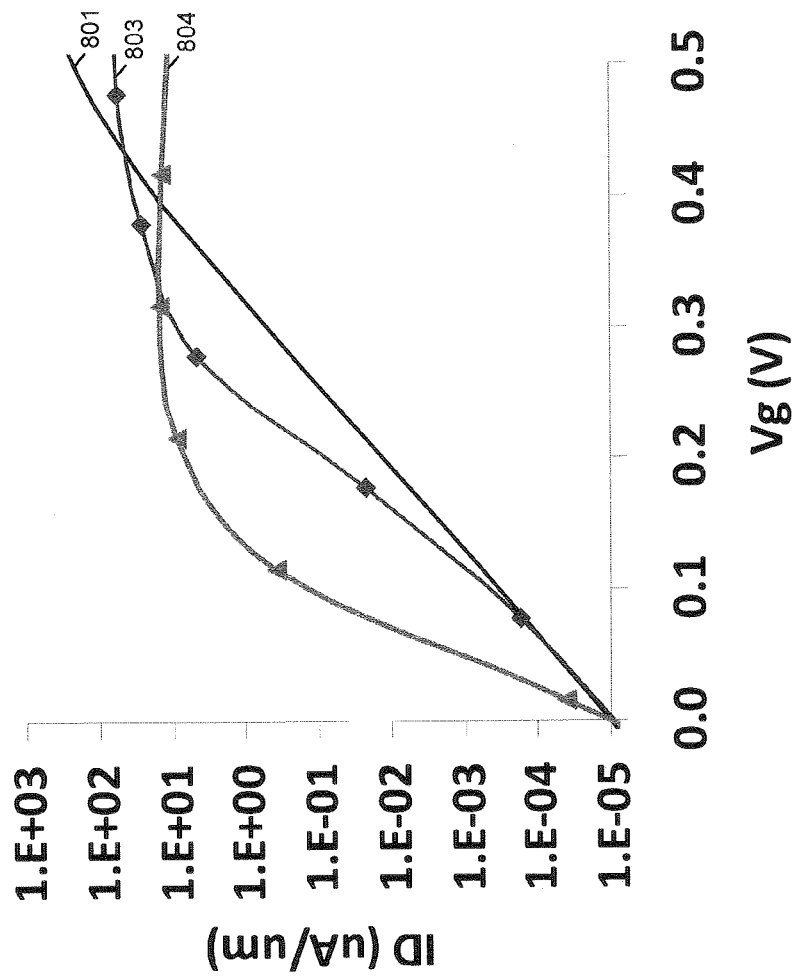

However, this behavior changes with a very short $L_g$ having confined channel dimensions. For a short $L_g$ a reverse heTFET has a very sharp subthreshold slope. This enables low supply voltage and low off current target operations, which both enable very low power products. For example, an embodiment includes a channel with $L_g$=9 nm included in a 3 nm wide and 3 nm tall nanowire (a semiconductor nanoscale structure). As seen in FIGS. 7 and 8, this reverse heTFET embodiment has a very sharp subthreshold slope. MOSFET (traces 701, 801), conventional heTFET (source=GaSb, drain=InAs) (traces 703, 803), and reverse heTFET (source=InAs, drain=GaSb) (traces 704, 804) are respectively plotted for $I_{off}$ targets of 1 nA/μm (FIG. 7) and 10 pA/μm (FIG. 8). All devices have $L_g$=9 nm. Reverse heTFETs show the best subthreshold slope and perform best at both $I_{off}$ targets with low supply voltages. Specifically, for FIG. 8 reverse heTFET trace 804 shows a 25 mV/dec subthreshold slope (between 0.0 and 0.1 $V_g$), whereas heterojunction device trace 803 shows a 47 mV/dec subthreshold slope, and MOSFET 801 shows a 63 mV/dec subthreshold slope. Thus, this embodiment of a reverse heTFET achieves a better on current than both MOSFETs and conventional heTFETs at low supply voltages.

An embodiment has improved transistor characteristics due to, for example, the discreet resonant states created by three dimensional confinement of the reverse heTFET channel. For example, an embodiment includes a channel with $L_g$ less than 10 nm, two dimensions are confined by using a nanowire width and height of 3 nm, and a third dimension confined due to the profile of band discontinuity between the source and channel of the embodiment. These resonant states enable a rapid change from $I_{off}$ to $I_{on}$ due to the tight Density of States (DOS) characteristics.

Figure 9:
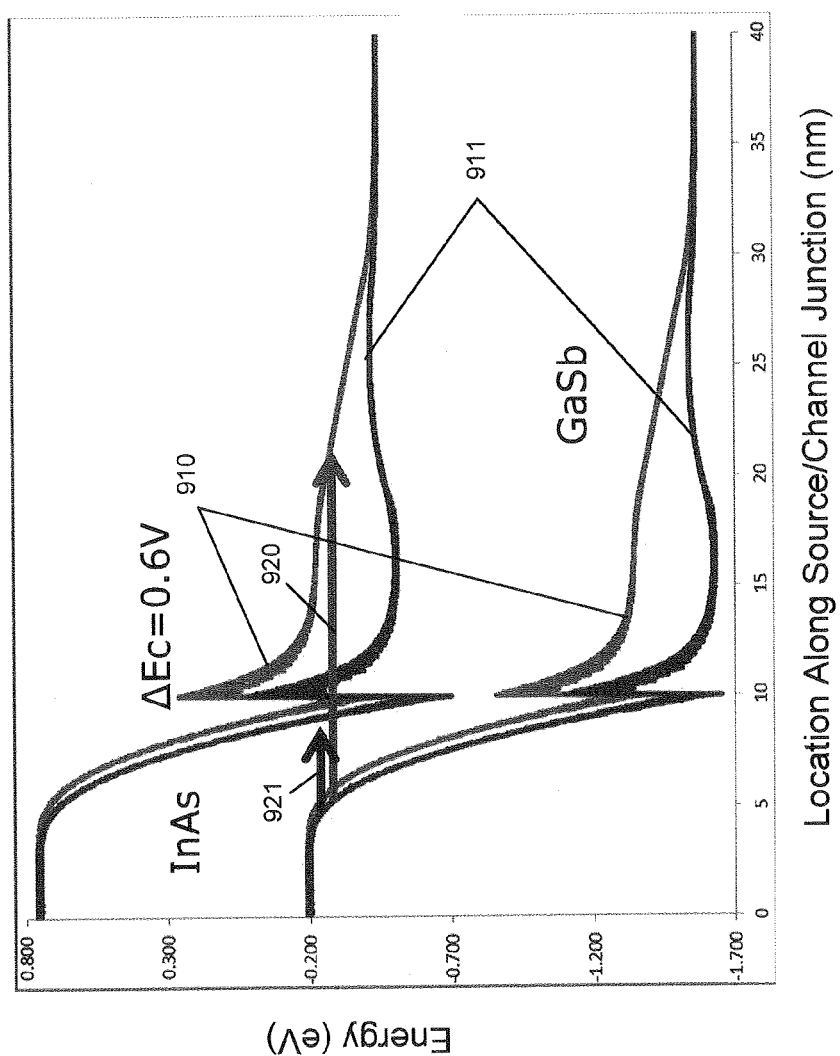
FIG. 9 concerns a reverse heTFET energy band diagram in an embodiment.

This rapid change from $I_{off}$ to $I_{on}$ is non-obvious when viewing a classical potential profile. For example, in an embodiment including a reverse heTFET the energy bands do not accurately explain the actual device operation. FIG. 9 shows classical band edges for the reverse heTFET at $I_{off}$ (traces 910) and (traces 911). Traces 910 correspond to conduction and valence bands at 0.0 eV and traces 911 correspond to conduction and valence bands at 0.3 eV. Tunneling distance 920 is large but even tunneling distance 921 remains large indicating a very low (undesirable) channel current in the on state.

Figure 10:
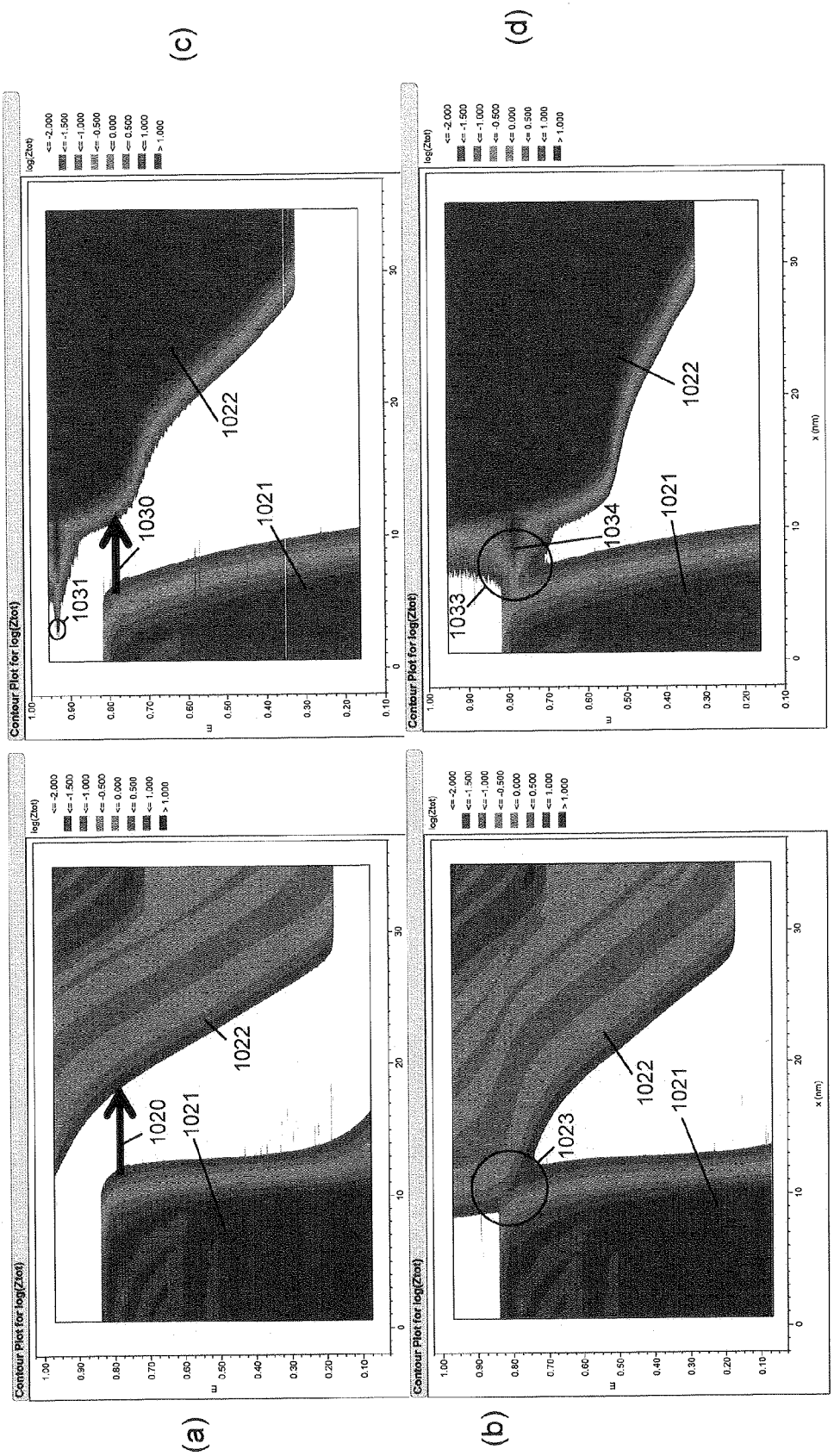
FIGS. 10(a)-(d) concern density of state (DOS) for an embodiment.

However, FIGS. 10(a)-(d) better illustrate operation of an embodiment of the device and why highly confined channel geometry favors reverse heTFETs over non-reverse heTFETs and MOSFETs. Due to the strong channel confinement, the allowed electron energies have peaks around the heterojunction interface region. Specifically, FIGS. 10(a)-(d) illustrate density of states (DOS) characteristics. DOS equals the density per unit volume and energy of the number of solutions to Schrödinger's equation. FIGS. 10(a) and (b) correspond to off and on states for a conventional heTFET (Lg=9 nm). FIGS. 10(c) and (d) correspond to off and on states for a reverse heTFET (Lg=9 nm). Until discrete energy states are aligned with the valance valence band on the source side (area 1021 for each of FIGS. 10(a)-(d)), the tunneling current is low due to the low DOS in the region necessary to conduct electrons. Thus, FIG. 10(a) shows a conventional heTFET in the off state with a large tunneling distance 1020. FIG. 10(c) shows an embodiment of a reverse heTFET in the off state with large tunneling distance 1030.

In FIG. 10(c) once Vg is increased for the conventional heTFET there is still low DOS (as understood from the shaded contour labels) at source/channel junction 1023. However, in FIG. 10(d) once the energy of the discrete levels is brought down to the level of the valance valence band of the source side 1021 (due to increasing Vg), there is a sharp increase in tunneling current that creates sharp subthreshold slope behavior. In other words, source/channel junction 1033 includes high DOS projection 1034 (which resembles a horizontal "needle" pointing to the left of the graph). High DOS projection 1031 is misaligned with the source valence band 1021 in Ioff (FIG. 10(c)); but projection 1034 is aligned with the source valence band 1021 in FIG. 10(d). More generally, FIG. 10(d) shows high DOS (darker portions are higher DOS) as a function of energy along the device near the source/channel junction (near the 10 nm mark on X axis). As a result, reverse heTFETs outperform conventional heTFETs at small Lg providing better on current at lower Vg.

An embodiment is implemented with the same or similar approach as conventional heTFETs (only with the switched semiconductor materials in the source and channel/drain regions as shown in FIG. 4). This enables heterogeneous integration of two devices, where, for example, high performance requiring circuits use the conventional heterojunction device and low power requiring circuits use the reverse heTFET on the same substrate.

Figure 11:
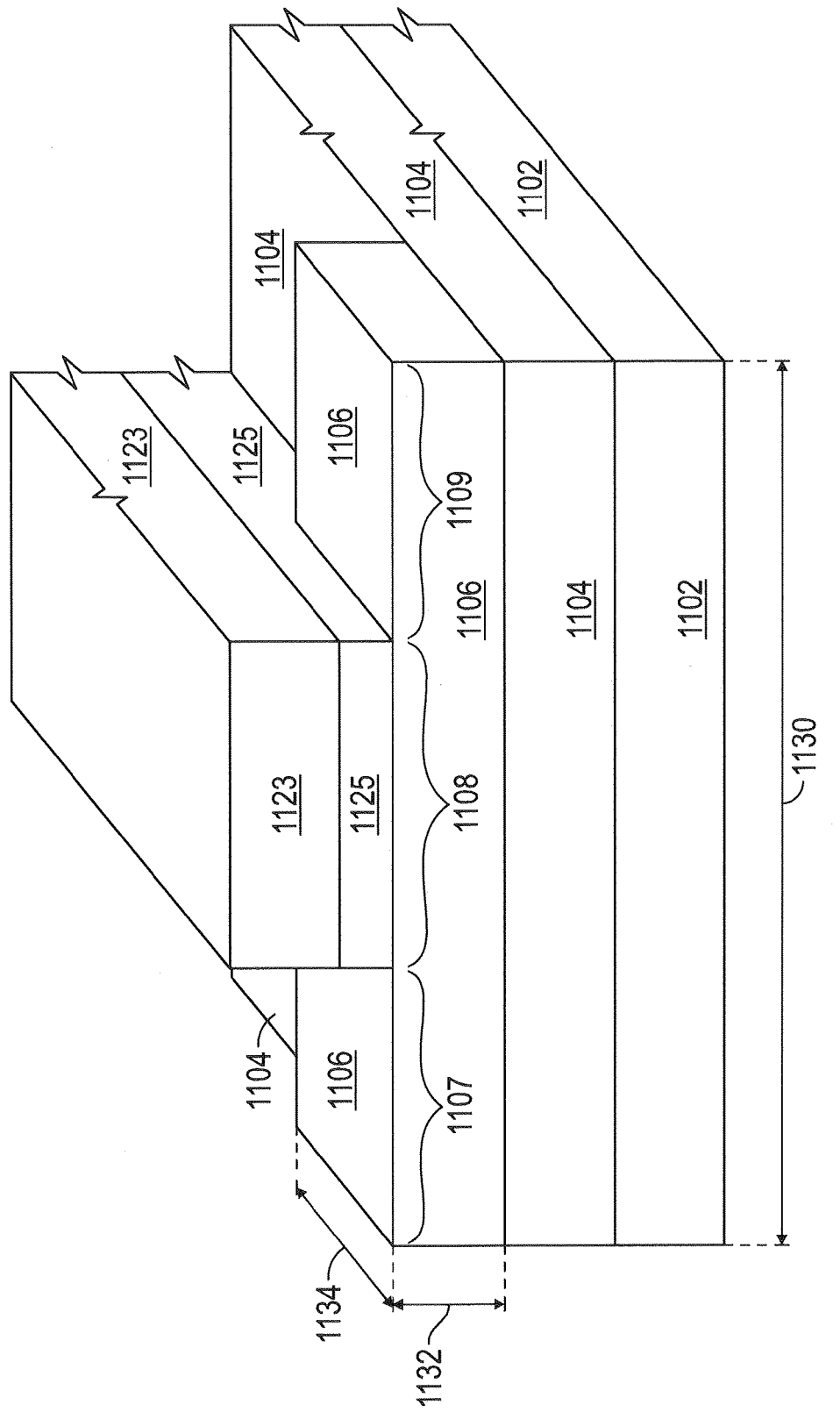
FIG. 11 includes a schematic cross section view of an embodiment.

Various methods for creating a narrow channel suitable for reverse heTFET are available. Such methods are described in, for example, U.S. Pat. No. 6,897,098, assigned to Intel Corporation (Santa Clara, Calif., U.S.A.) and entitled "Method of fabricating an ultra-narrow channel semiconductor device". As detailed in U.S. Pat. No. 6,897,098, a small scale channel suitable for use in various embodiments of the invention is produced as follows. Nanowire 1106 is deposited on first dielectric layer 1104, which is formed on substrate 1102 (see FIG. 11). The nanowire has a first dimension. The nanowire provides first region 1108, second region 1107, and third region 1109. A sacrificial gate stack having a sacrificial dielectric layer and a sacrificial gate electrode layer is deposited over first region 1108 of the nanowire leaving exposed the second region and the third region of the nanowire. A first spacer is deposited adjacent each side of the sacrificial gate stack. A second dielectric layer is deposited over the first dielectric layer to cover the second region and third region. The sacrificial gate electrode and the sacrificial dielectric layer are removed after the first spacer is deposited. Removing the sacrificial gate electrode and the sacrificial dielectric layer exposes the first region of the nanowire. The first region of the nanowire is thinned by at least one thermal oxidation and oxide removal process. After thinning, the first region has a second dimension that is smaller than the first dimension Thinning the first region of the nanowire provide the first region of the nanowire with a cross-sectional dimension that is substantially smaller (e.g., ten times or at least two times smaller) than that of the second region and the third region. First region can be middle region 108 of the nanowire and the second and third regions 1107, 1109 can be the side regions of the nanowire. Dielectric layer 1125 and gate electrode layer 1123 may be added.

In one embodiment, the nanowire has first cross-sectional dimensions that are in the order of nanoscale. The nanowire has length 1130 of about 2, 3, 4, 5, 6, 7, 8, 9, 10, 11, 12, 13, 14, or 15 nm, height 132 of about 2, 3, 4, 5, 6, 7, 8, 9, 10, 11, 12, 13, 14, or 15 nm, and width 134 of about 2, 3, 4, 5, 6, 7, 8, 9, 10, 11, 12, 13, 14, or 15 nm. The height, width, and length can be varied depending on the methods used to form the nanowire. As shown above, some embodiments include a length, width, height combinations of 10, 3, and 3 nm. But other embodiments include, for example and without limitation, length, width, height combinations of 8, 3, and 3 nm; 12, 3, and 3 nm; 8, 2, and 2 nm; and the like.

In one embodiment, before thinning, the middle region has the same initial thickness or cross-sectional dimension as the rest of the nanowire. After thinning, the middle region will have a cross-sectional dimension that is smaller or substantially smaller than other portions of nanowire 1106. In one embodiment, the thinned middle portion has width and/or height less than about 5 nm or less than about 2-3 nm. In some embodiments there is no thinning of middle portion 1108, which has the same height and width as portions 1107, 1109.

In one embodiment, the second region and the third region are implanted using conventional methods such as ion implantation to form the source/drain regions for a semiconductor device. For example, for an n heTFET region 1107 may be a p doped source, channel region 1108 may be intrinsic, and region 1109 may be an n doped drain. In another embodiment, for a p heTFET region 1107 may be a p doped drain, channel region 1108 may be intrinsic, and region 1109 may be n doped source. The source and drain may be different materials in terms of doping concentration, material concentrations (e.g., $In_xGa_{1-x}As$ and $In_yGa_{1-y}As$, where x is not equal to y), and materials (e.g., InAs and GaSb).

A silicide layer can be formed over each of the second region and the third region after the implantation to facilitate contacts to the source/drain regions. The silicide layer provides a low contact resistance to the source/drain regions formed in the second region and the third region. The silicide layer can be formed of a metal such as cobalt, nickel, and the like. The silicide layer can be formed using conventional methods that deposit the metal over the second region and the third region. After the metal is deposited, heat is applied to these regions to allow the silicon in these regions to react with the metals to form silicide.

Thus, as indicated above, an embodiment includes an heTFET including a source, a channel, and a drain; wherein the channel includes a major axis, corresponding to channel length, and a minor axis that corresponds to channel width and is orthogonal to the major axis. In an embodiment the channel length is less than 10 nm long; but in other embodiments the length is longer (e.g., 10 or 15 nm) or shorter (e.g., 3 or nm). In one embodiment the channel width is less than 5 nm wide, but in other embodiments the width is wider (e.g., 7 or 9 nm) or narrower (e.g., 2 or 3). In one embodiment the channel height is less than 5 nm wide, but in other embodiments the height is taller (e.g., 7 or 9 nm) or shorter (e.g., 2 or 3). For a p heTFET the source is doped with a first polarity (n) and has a first conduction band; and the drain is doped with a second polarity (p), and the drain has a second conduction band that is higher than the first conduction band. The doping polarity is opposite for an n heTFET. In one embodiment the off current is less than 3 nA and may extend down to, for example, 1 pA, but in other embodiments the off current may be 1 or 2 nA or 4, 5, 6, 7, 8, 9 or more nA. In one embodiment the subthreshold gate voltage to logarithm of drain current ratio (the subthreshold slope), which occurs between transition from off state to on state, is less than 30 mV/dec but in other embodiments the slope is 15, 20, 25, 35, or 40 mV/dec.

An embodiment includes an apparatus comprising: a heterojunction tunneling field effect transistor including a source, a channel, and a drain; wherein (a) the channel includes a major axis, corresponding to channel length, and a minor axis that corresponds to channel width and is orthogonal to the major axis; (b) the channel length is less than 10 nm long; (c) the source is doped with a first polarity and has a first conduction band; (d) the drain is doped with a second polarity, which is opposite the first polarity, and the drain has a second conduction band that has higher energy than the first conduction band. In an embodiment the first polarity is positive. In an embodiment the source includes InAs. In an embodiment the drain includes GaSb. In an embodiment the channel width is less than 4 nm wide. In an embodiment the channel includes a nanowire. In an embodiment the off current is less than 3 nA. In an embodiment the subthreshold gate voltage to drain current ratio, which occurs between the transition from off state to on state, is less than 30 mV/dec. In an embodiment the DOS at a junction between the source and channel includes a triangular projection misaligned with a valence band for the source in an "off state" and aligned with the valence band in an "on state". In an embodiment allowed electron energy states have a peak at a junction between the source and channel in an on state. In an embodiment the heTFET is a reverse heterojunction TFET, the apparatus comprising a non-reverse heterojunction TFET (i.e., heterojunction TFET) in a substrate that also includes the reverse heterojunction TFET.

An embodiment includes an apparatus comprising: a heterojunction tunneling field effect transistor including a source, a channel, and a drain; wherein the channel length is less than 10 nm long; the drain has conduction band with higher energy than a conduction band of the source; and the transistor includes a subthreshold gate voltage to drain current ratio, which occurs between transition from "off state" to "on state", less than 30 mV/dec. In an embodiment the DOS at a junction between the source and channel includes a triangular projection misaligned with a valence band for the source in an "off state" and aligned with the valence band in an "on state". In an embodiment allowed electron energy states have a peak at a junction between the source and channel in an on state.

An embodiment includes an apparatus comprising: a substrate; a first heTFET including a first source, a first channel, and a first drain; wherein the first channel length is less than 10 nm long, the first drain has conduction band with higher energy than a conduction band of the first source, and the heTFET is formed on the substrate; and a second heTFET including a second source, a second channel, and a second drain; wherein the second drain has conduction band with lower energy than a conduction band of the second source, and the second heTFET is formed on the substrate. In an embodiment the first heTFET includes a subthreshold gate voltage to drain current slope, which occurs between transition from "off state" to "on state", less than 30 mV/dec. In an embodiment the first channel width is less than 4 nm wide. In an embodiment off current for the first heTFET is less than 3 nA.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:
1. An apparatus comprising:
an n heterojunction tunneling field effect transistor (n-heTFET) including a source, a channel, and a drain; wherein:
(a) the channel includes a major axis, corresponding to channel length, and a minor axis that corresponds to channel width and is orthogonal to the major axis;
(b) the channel length is less than 10 nm long;
(c) the source is positively doped and has a first conduction band;
(d) the drain is negatively doped and has a second conduction band with higher energy than the first conduction band;
(e) the source and the drain respectively include one of InAs and GaSb; Si and InAs; Si and SiGe; GaAsSb and InAsSb; and InGaAs and InP.
2. The apparatus of claim 1 wherein the source includes InAs.
3. The apparatus of claim 2 wherein the drain includes GaSb.
4. The apparatus of claim 1 wherein the channel width is less than 4 nm wide.
5. The apparatus of claim 1 wherein the channel includes a nanowire.
6. The apparatus of claim 1 wherein an off current for the n-heTFET is less than 3 nA.
7. The apparatus of claim 1 wherein the n-heTFET includes a subthreshold gate voltage to drain current ratio, which occurs between a transition from an off state to an on state, of less than 30 mV/dec.
8. The apparatus of claim 1 wherein a density of states (DOS) at a junction between the source and the channel includes a triangular projection misaligned with a valence band for the source in an off state and aligned with the valence band in an on state.
9. The apparatus of claim 1 wherein allowed electron energy states have a peak at a junction between the source and the channel in an on state.
10. The apparatus of claim 1, comprising a heTFET on a substrate that also includes the n-heTFET, wherein the heTFET includes an additional source and an additional drain and the additional source has a conduction band with higher energy than a conduction band of the additional drain.
11. An apparatus comprising:
a substrate;
a first n heterojunction tunneling field effect transistor (n-heTFET) including a positively doped first source, a first channel, and a negatively doped first drain; wherein the first channel length is less than 10 nm long, the first drain has a conduction band with higher energy than a conduction band of the first source, and the first n-heTFET is formed on the substrate; and
a second heTFET including a second source, a second channel, and a second drain; wherein the second drain has a conduction band with lower energy than a conduction band of the second source, and the second heTFET is formed on the substrate;
wherein the first source and the first drain respectively include one of InAs and GaSb; Si and InAs; Si and SiGe; GaAsSb and InAsSb; and InGaAs and InP.
12. The apparatus of claim 11 wherein the first n-heTFET includes a subthreshold gate voltage to drain current ratio, which occurs between a transition from an off state to an on state, of less than 30 mV/dec.
13. The apparatus of claim 11 wherein the first channel width is less than 4 nm wide.
14. The apparatus of claim 13 wherein an off current for the first n-heTFET is less than 3 nA.

* * * * *